(12) United States Patent
Colello et al.

(10) Patent No.: US 7,939,190 B2
(45) Date of Patent: May 10, 2011

(54) SYSTEMS AND METHODS FOR SELECTIVE CELL AND/OR STACK CONTROL IN A FLOWING ELECTROLYTE BATTERY

(75) Inventors: Gary M. Colello, North Andover, MA (US); Dennis M. Darcy, Dracut, MA (US)

(73) Assignee: Premium Power Corporation, North Reading, MA (US)

( * ) Notice: Subject to any disclaimer, the term of this patent is extended or adjusted under 35 U.S.C. 154(b) by 602 days.

(21) Appl. No.: 10/886,881

(22) Filed: Jul. 8, 2004

(65) Prior Publication Data

US 2005/0084745 A1 Apr. 21, 2005

Related U.S. Application Data

(60) Provisional application No. 60/485,871, filed on Jul. 9, 2003.

(51) Int. Cl.
*H01M 2/00* (2006.01)
*H01M 2/38* (2006.01)
*H01M 6/42* (2006.01)
*G05D 23/00* (2006.01)

(52) U.S. Cl. ............. 429/61; 429/81; 429/149; 700/297
(58) Field of Classification Search .................... 429/61, 429/149, 81; 700/297
See application file for complete search history.

(56) References Cited

U.S. PATENT DOCUMENTS

| 3,942,104 A | 3/1976 | Byrne |
| 4,016,474 A | 4/1977 | Mason |
| 4,028,616 A | 6/1977 | Stevens |
| 4,072,540 A | 2/1978 | Symons et al. |
| 4,105,829 A | 8/1978 | Venero |
| 4,144,381 A | 3/1979 | Fatica |
| 4,321,312 A | 3/1982 | Fujii et al. |
| 4,343,868 A | 8/1982 | Putt |
| 4,399,200 A | 8/1983 | Galloway |
| 4,484,130 A | 11/1984 | Lowndes et al. |
| 4,491,625 A | 1/1985 | Katner |
| 4,540,639 A | 9/1985 | Grimes |
| 4,614,693 A | 9/1986 | Hashimoto et al. |
| 4,615,108 A | 10/1986 | Tomazic |
| 4,616,170 A | 10/1986 | Urstoger |
| 4,628,302 A | 12/1986 | Barr et al. |
| 4,663,251 A | 5/1987 | Sasaki et al. |
| 4,665,322 A | 5/1987 | Eishima et al. |
| 4,677,039 A | 6/1987 | Sasaki et al. |
| 4,691,158 A | 9/1987 | Hashimoto et al. |
| 4,745,349 A | 5/1988 | Palanisamy |
| 4,766,045 A | 8/1988 | Bellows et al. |

(Continued)

FOREIGN PATENT DOCUMENTS

DE 2028117 12/1970

(Continued)

OTHER PUBLICATIONS

Patent abstract of Japan, vol. 14, 467 E-989 abstract of JP, A, 2-189868, Toyota Motor Corp, Jul. 25, 1990.

(Continued)

*Primary Examiner* — Karie O'Neill Apicella
(74) *Attorney, Agent, or Firm* — Lathrop & Gage LLP

(57) ABSTRACT

The invention provides in various embodiments methods and systems relating to controlling energy storage units in flowing electrolyte batteries.

14 Claims, 8 Drawing Sheets

U.S. PATENT DOCUMENTS

| | | | |
|---|---|---|---|
| 4,803,416 | A | 2/1989 | Abiven et al. |
| 4,818,642 | A | 4/1989 | Bellows et al. |
| 4,820,965 | A | 4/1989 | Siemer |
| 4,876,495 | A | 10/1989 | Palanisamy |
| 5,061,578 | A | 10/1991 | Kozuma et al. |
| 5,075,565 | A | 12/1991 | Severinsky et al. |
| 5,160,880 | A | 11/1992 | Palanisamy |
| 5,177,425 | A | 1/1993 | Goto |
| 5,197,994 | A | 3/1993 | Brocksmith |
| 5,391,973 | A | 2/1995 | Tomazic |
| 5,394,862 | A | 3/1995 | Firatli et al. |
| 5,436,087 | A | 7/1995 | Tomazic |
| 5,459,390 | A | 10/1995 | Tomazic |
| 5,498,950 | A | 3/1996 | Ouwerkerk |
| 5,631,814 | A | 5/1997 | Zak |
| 5,739,596 | A * | 4/1998 | Takizawa et al. ............... 307/66 |
| 5,744,936 | A | 4/1998 | Kawalami |
| 5,889,385 | A | 3/1999 | Podrazhansky et al. |
| 5,898,291 | A | 4/1999 | Hall |
| 5,982,645 | A | 11/1999 | Levran et al. |
| 6,184,656 | B1 | 2/2001 | Karunasiri et al. |
| 6,242,125 | B1 * | 6/2001 | Eidler et al. ..................... 429/51 |
| 6,308,728 | B1 | 10/2001 | Frazier |
| 6,355,373 | B1 | 3/2002 | Pauling |
| 6,369,546 | B1 | 4/2002 | Canter |
| 6,430,692 | B1 | 8/2002 | Kimble et al. |
| 6,680,600 | B2 | 1/2004 | Emori et al. |
| 6,759,158 | B2 | 7/2004 | Tomazic |
| 2001/0006747 | A1 | 7/2001 | Vanhee |
| 2003/0007370 | A1 | 1/2003 | Winter |
| 2003/0008204 | A1 * | 1/2003 | Winter et al. ................... 429/81 |
| 2003/0042866 | A1 * | 3/2003 | Minamiura et al. .......... 320/104 |
| 2003/0094928 | A1 * | 5/2003 | Emori et al. .................. 320/162 |
| 2003/0124415 | A1 * | 7/2003 | Tomazic ......................... 429/61 |

FOREIGN PATENT DOCUMENTS

| | | |
|---|---|---|
| DE | 3408373 | 6/1986 |
| DE | 3811371 | 10/1989 |
| EP | 1355056 | 3/1985 |
| EP | 0149448 | 7/1985 |
| EP | 0165000 | 12/1985 |
| EP | 0167517 | 1/1986 |
| EP | 0168377 | 1/1986 |
| EP | 0207057 | 12/1986 |
| EP | 0223768 | 5/1987 |
| EP | 0225315 | 6/1987 |
| EP | 0228361 | 7/1987 |
| EP | 0277937 | 8/1988 |
| EP | 0291496 | 11/1988 |
| EP | 0327528 | 8/1989 |
| EP | 0343144 | 11/1989 |
| EP | 0411614 | 2/1991 |
| EP | 0434659 | 6/1991 |
| EP | 0438044 | 7/1991 |
| EP | 0479765 | 4/1992 |
| EP | 1085592 | 3/2001 |
| EP | 1308739 | 5/2003 |
| JP | 63245228 | 3/1990 |
| JP | 3143420 | 6/1991 |
| JP | 2001025173 | 1/2001 |
| JP | 2001236997 | 8/2001 |
| JP | 2003-164068 | 6/2006 |
| SU | 1465930 A1 | 3/1989 |

OTHER PUBLICATIONS

Linden, Handbook of Batteries and Fuel Cells, McGraw Hill, pp. 29-1 to 29-8 and A4.

Written Opinion of the International Search Authority dated Dec. 8, 2004 issued in related PCT Patent Application Serial No. PCT/US2004/022046.

International Preliminary Report on Patentability dated Jan. 9, 2006 issued in related PCT Patent Application Serial No. PCT/US2004/022046.

Examination Report dated Jun. 30, 2006 issued in related European Patent Application Serial No. 04777865.9.

Reply to Examination Report dated Jun. 30, 2006 issued in related European Patent Application Serial No. 04777865.9 filed Jan. 10, 2007.

Office Action issued in related Japanese Patent Application Serial No. 2006-518934, issued Sep. 17, 2008, 7 pages.

Office Action issued in related Russian Patent Application Serial No. 2006103792, dated Jul. 7, 2008, 13 pages.

Office Action issued in related Australian Patent Application Serial No. 2004258144, issued Oct. 17, 2008, 3 pages.

Russian Application No. 2006103792, Decision on Grant with English translation dated Jun. 23, 2009, 22 pages.

Russian Application No. 2006103792, Office Action with English language Summary, Apr. 3, 2009, 14 pages.

English translation of Official Action (Inquiry) dated Mar. 29, 2010 in related Japanese Patent Application No. 2006-518934, 7 pages.

English translation of Final Official Action dated Aug. 12, 2009 in related Japanese Patent Application No. 2006-518934, 4 pages.

Australian Patent Application No. 2004258144, Notice of Acceptance dated Nov. 18, 2009, 3 pages.

Australian Patent Application No. 2004258144, Response to Examiner's Report filed Oct. 17, 2009, 25 pages.

* cited by examiner

SYSTEMS AND METHODS FOR SELECTIVE CELL AND/OR STACK CONTROL IN A FLOWING ELECTROLYTE BATTERY

CROSS-REFERENCE TO RELATED APPLICATIONS

This application is related to and claims the benefit of pending U.S. Provisional Patent Application No. 60/485,871, filed on Jul. 9, 2003, and entitled "Features, Controls and Methods Relating to a Flowing Electrolyte Battery and a Uninterruptible Power Source Employing a Flowing Electrolyte Battery" the entire contents of which are incorporated herein by reference.

FIELD OF THE INVENTION

The invention relates generally to operation of flowing electrolyte batteries. In particular, in one aspect, the invention relates to methods and systems for controlling, monitoring, charging, and/or discharging (collectively "controlling") flowing electrolyte batteries.

BACKGROUND OF THE INVENTION

Blackouts and other power inconsistencies present a problem for power users. Even seconds of downtime or minor aberrations in power quality can translate into millions of dollars of loss for businesses. The Electric Power Research Institute (EPRI) has estimated that power disturbances cost industry as much as $400 billion a year.

The public utility grid was not designed, nor is it equipped to deliver power without interruption. It also lacks the ability to modulate, condition and improve the power it delivers—increasing the risk that customers will be subjected to surges, sags and other power quality inconsistencies. Furthermore, the more than 2.5 million miles of electric wire that deliver power from the country's main grids are vulnerable to all types of risk. Severe weather can cause major outages, but even the occasional downed wire or broken pole can threaten to shut down production, leave workers idle, and/or stop communications.

Alternatives to reliance on a public utility grid include distributed generation systems that, once installed at a customer's site, can boost generation capacity for continuous and backup power, relieve transmission and distribution bottlenecks, and support power system maintenance by generating temporary backup power. Distributed power models also offer customers the flexibility to customize their power system based on their individual needs, and they are sited and installed in much less time than it takes to conduct conventional central plant system power generation upgrades.

Existing alternatives, however, still leave companies with no fully satisfactory distributed generation system. Fuel cells, for example, require more development before being suited for distributed power generation. Other options include solar, wind, reciprocating engines and micro turbines. All of these options, however, require local energy storage to work effectively. Solar and wind power are energy sources of opportunity, meaning they are not always available all day every day. Fuel cells and micro-turbines are steady state devices that can make use of natural gas. These technologies, however, do not load follow. Consequently, transients need to be supplied from storage. Use of these technologies, requires the availability of effective and reliable storage systems.

One type of energy storage system is an electrolyte battery. Such a battery can be configured as an array of stacks of cells (typically lead-acid cells), with each stack of cells having its own electrolyte. Since each stack is a closed system, the open-circuit voltage ($V_{oc}$) across a stack is indicative of the amount of charge stored in that particular stack. Differences in the open-circuit voltages between stacks can be used to determine which stacks in the system are fully charged and which are only partially charged.

A second type of electrolyte battery is a flowing electrolyte battery. One such battery employs an array of stacks of cells, where the stacks share a common flowing electrolyte. Since the stacks share the electrolyte, measurements of the open-circuit voltage across a stack only indicate whether the stack stores some non-zero amount of charge, rather than indicating the stack's state of charge relative to the other stacks in the system. Moreover, differences in the open circuit voltages between stacks are typically indicative of some internal abnormality that has lowered a stack's internal resistance.

For example, in a zinc-bromide flowing electrolyte battery, the stacks share an aqueous zinc bromide electrolyte and have their own electrodes for deposit and dissolution of elemental zinc during charge and discharge cycles. In this type of battery, the electrolyte flow to a stack can be inhibited by poorly placed zinc deposits. Additionally, nucleation on the electrodes can cause dendrite formation and branching between cells. In either case, the internal resistance of the affected stack is lowered, causing a corresponding drop in the open-circuit voltage across the stack.

Differences in open-circuit voltages between stacks in flowing electrolyte battery systems can affect the charge and discharge cycles of the stacks and, potentially, the operation of the battery. For example, in the aforementioned zinc-bromide battery, a lowered open circuit voltage in a particular stack causes an increase in the rate of zinc accumulation in the faulty stack during the charge cycle and a decrease in the rate of zinc reduction in the faulty stack during the discharge cycle. Moreover, the additional zinc stored in the faulty stack typically comes from the electrolyte normally utilized by neighboring stacks. As a result of the lowered zinc availability, the energy storage capacity of the neighboring stacks may be reduced. Another consequence is that the stack having the increased zinc accumulation does not fully strip during discharge; eventually resulting in zinc accumulating on the electrodes of the faulty stack to such an extent that it causes internal short circuiting between the cells of the stack. This can potentially destroy the stack and possibly, the entire battery. A further consequence is that the increased zinc accumulation restricts the channels through which the electrolyte flows. As the electrolyte flow acts to cool the stack, the restricted flow may cause the stack to over heat and melt critical components.

Prior art solutions to this problem have involved fully "stripping" i.e., fully discharging, each stack in the battery, completely removing any stored charge from all of the cells in all of the stacks. Ideally, this process eliminates the abnormality that initially caused the difference in open-circuit voltage between the stacks. For example, a full strip typically dissolves dendrites between plates and/or deposits obstructing electrolyte flow. However, a full strip of a flowing electrolyte battery is typically time consuming (often taking one or two days to complete) and may have to be repeated every few days for a recurring problem. A full strip of the battery typically renders it unavailable or at a significantly reduced capacity for electrical applications, necessitating the purchase and installation of additional redundant battery systems. Moreover, a full strip is often unnecessary since typically a minority of the stacks in the battery is operating abnormally.

Therefore, there is a need for improved methods and apparatus for controlling, monitoring, charging and/or discharging cells in a flowing electrolyte battery.

SUMMARY OF THE INVENTION

The invention addresses the deficiencies in the prior art by providing, in various embodiments, improved, methods, systems and features for controlling, monitoring, charging and/or discharging (collectively "controlling") flowing electrolyte batteries. According to one aspect, the invention addresses the deficiencies in the prior art by providing methods, systems and features for controlling individual stacks of battery cells in a flowing electrolyte battery. In a further embodiment, the invention provides methods, systems and features for controlling individual battery cells in a flowing electrolyte battery. Among other advantages, the invention increases the flexibility with which cell stacks can be charged and stripped; enables regular and ongoing battery maintenance, without taking the battery offline; maintains the battery at a predictable and consistent charge capacity; reduces the likelihood of stack failures due, for example, to electrolyte flow blockage, thermal runaway, and/or dendrite formation; reduces the risk of uneven cell plating; increases the number of charge/discharge cycles available; and reduces expenses relating to maintaining redundant battery systems.

In one aspect, the invention provides a systems and methods for individually controlling cell stacks in a flowing electrolyte battery having a plurality of cell stacks. Preferably, the battery is a flowing zinc bromide battery. However, the invention may be employed with any suitable flowing electrolyte battery. According to one configuration, the invention includes a stack controller for operable interconnection to one of a plurality of the cell stacks in the battery. According to one feature, the stack controller controls current flow, individually, through the cell stack. According to one embodiment, the system includes a plurality of stack controllers, with each one being associated for operable interconnection to an associated one of the plurality of cell stacks. In one preferred configuration, the interconnection between the cell stacks and the stack controllers may be via electrical interconnection. However, in other configurations, the interconnection may be optical, a combination of electrical and optical or any suitable direct or electrically isolated interconnection approach.

According to an alternative embodiment, rather than having individual cell stack controllers, a single master controller controls the individual cell stacks. As in the case of the individual controllers, the single master controller controls the current flow to each cell stack on a stack-by-stack basis; thus, providing all of the important advantages of the individual stack controllers. In another alternative embodiment, rather than having a single master controller, a plurality of controllers, less than the number of cell stacks, control the individual cells stacks. In a further alternative embodiment, the invention provides a multilevel stack controller architecture in which, a master controller provides direction to one or more additional stack controllers to provide individual stack control.

In some embodiments, current control to each cell stack is substantially or completely unaffected by current control provided to another cell stack. However, in some embodiments, current control to a particular stack is allowed to affect current control to another stack, but in predictable and controllable manner.

In one embodiment, a stack controller provides control signals to one or more solid state switches to control current flow to (e.g., charging) and/or from (e.g., discharging) a cell stack. According to one approach, the master and/or individual controllers regulate a duty cycle of a control signal to the one or more solid state switches to control the current cell stacks.

According to an alternative embodiment, the invention provides an individual dc/dc converter/controller for each cell stack. Preferably, the dc/dc converter/controller controls current flow to and from the cell stack. According to one feature, each dc/dc converter/controller operates substantially or completely independently from each other dc/dc converter/controller and provides, for example, charging, discharging, electrode plating, electrode stripping, electrolyte flow and cell stack maintenance control for an associated cell stack. According to another feature, each dc/dc converter/controller provides voltage, current, electrolyte flow, and temperature monitoring for an associated cell stack. According to another feature, the dc/dc converter/controller, in response to, for example, an under current, over current, under voltage, over voltage, under charge, over charge, and/or over temperature condition, can take an associated individual cell stack off line (e.g., for maintenance), without substantially affecting operation of the battery as a whole.

As discussed going forward, the term "stack controller", may include any of the above discussed stack controller configurations, including the dc/dc converter/controller or any other suitable controller configuration that enables control of individual cell stacks.

According to another feature, the invention monitors the current through each cell stack, and based on the measured current, alters the current being directed to or away from the cell stack. In one embodiment, the stack controller calculates an average of the currents through each of the cell stacks, and then adjusts the current through particular ones of the cell stacks based on how many amperes the monitored current flow deviates from the calculated average. According to one implementation, the invention provides a threshold current deviation from the average that must be exceeded prior to making any adjustment in current flow to a cell stack. By way of example, the invention may require greater than a plus or minus 0.1 A, 0.25 A, 0.5 A, 0.75 A, 1 A, 1.5 A, 2 A, 2.5 A or 3. A, deviation from the calculated average, prior to adjusting the current through a particular cell stack.

According to one embodiment, the invention takes a current measurement of all of the cell stacks periodically, calculates the average cell stack current, ranks the currents in order of deviation from the average, and schedules the cell stacks for current adjustment based on the ranking; adjusting those cell stacks with the largest current deviation from the average first and progressing through the ones with the least deviation from the average. In one approach, the invention adjusts the currents by scheduling a current deprivation, whereas in other approaches, the invention schedules provision of additional current to deviating cell stacks, and/or provides a combination of current addition and current deprivation, depending, for example, on whether the current flow to a cell stack is higher than the average or lower than the average.

In other embodiments, the invention adjusts the currents to multiple cell stacks in a substantially concurrent fashion, and in one particular embodiment, adjusts all of the currents to all of the cell stacks in a substantially concurrent or simultaneous manner. According to one configuration, the invention adjusts the current flow to a cell stack in a fashion that is linearly dependent on the current deviation from the average. However, in other embodiments, other suitable relationships may be employed.

In another aspect, the invention monitors a subset of the current flows through the cell stacks substantially in real time.

The invention may also calculate the average of the currents through the cell stacks in substantially real time. According to a further embodiment, the invention performs current adjustments in substantially real time, and optionally, substantially concurrently. The subset of cell stacks may include all of the cell stacks.

According to an alternative embodiment, rather than calculating an average current through the cell stacks, the stack controller monitors the current flow through a cell stack and adjusts current flow through the cell stack, based substantially solely on a deviation from an expected current flow through the cell stack. In one implementation, the invention provides a threshold current deviation from the expected current that must be exceeded prior to making any adjustment in current flow to the cell stack. By way of example, the invention may require greater than a plus or minus 0.1 A, 0.25 A, 0.5 A, 0.75 A, 1 A, 1.5 A, 2 A, 2.5 A or 3. A, deviation from the expected current flow, prior to adjusting the current through the cell stack.

According to a further feature, the invention includes hysteresis in the decision as to whether to make a cell stack current adjustment. The invention may also include, for example, a state of cell stack voltage, temperature, electrolyte flow, and/or charge in the decision as to whether to alter current flow to a cell stack.

While in some aspects, the invention particularly excludes the battery cell stacks and the particular devices in series with the cell stacks through which the charging/discharging current flows, in other aspects, the invention particularly includes the current flow devices (e.g., the solid state and/or mechanical switches), and/or the cell stacks and/or the entire flowing electrolyte battery.

According to another aspect, a stack controller is in communication with a sensor for detecting fault conditions in a particular cell stack and a stack controller for altering a charging condition of the cell stack in response to a fault condition.

In one embodiment, the sensor includes a voltage sensor for monitoring an open-circuit voltage across one or more of the cell stacks. In another embodiment, the sensor includes a current sensor for monitoring the current entering and/or leaving one or more of the cell stacks. In another embodiment, the invention includes a history logger for recording sensor readings with regard to particular cell stacks. According to another embodiment, the sensor includes an electrolyte flow sensor for monitoring circulating electrolyte in the battery. In one configuration, the electrolyte flow sensor includes a pump sensor for detecting when an electrolyte pump is pumping. In another embodiment, the invention includes a timer for determining the passage of a predetermined increment of time.

According to one aspect, the invention includes a switch in communication with or as part of the stack controller, where the switch modulates a charging current supplied to the stack in response to a fault condition. In another embodiment, the invention includes a switch in communication with or as part of the stack controller and a resistive element in communication with the switch, where the switch places a resistor across the stack to discharge is in response to a fault condition or as a way of performing maintenance. In another embodiment, the invention includes a switch in communication with or as part of the stack controller, where the switch can be shorted across the terminals of the cell stack used to complete a discharge process in response to a fault condition or as a mechanism for performing maintenance. In another embodiment, the invention includes a switch in communication with or as part of the stack controller, where the switch can divert current through a resistive element when the current to the stack is interrupted the current distribution through the other batter stacks will be unaffected.

In another aspect, the invention provides a method for individual cell stack control in a flowing electrolyte battery. According to one embodiment, in response to detecting a fault condition in an individual cell stack, the method of the invention alters a charging condition associated with the cell stack. According to an additional feature, in response to detecting correction of the detected fault condition, the method of the invention again alters a charging condition associated with the cell stack.

In one embodiment, the step of altering the charging condition in response to the correction of the fault condition includes restoring the charging condition to its original state. In another embodiment, the step of detecting the fault condition includes detecting a change in an open-circuit voltage across the cell stack and/or detecting a change in a current flow to the cell stack.

According to a further embodiment, the step of altering the charging condition in response to the detection of the fault condition includes reducing the amount of current charging the cell stack. In another embodiment, reducing the amount of current includes applying a pulse-width modulation with a duty cycle less than 100% to a circuit charging the cell stack. In another embodiment, reducing the amount of current includes altering the current output from a dc/dc converter/controller to the cell stack.

In one embodiment, the step of altering a charging condition in response to the detection of the fault condition includes reducing the amount of current charging a particular cell stack, while maintaining the amount of current charging another one of the cell stacks at a constant. In another embodiment, reducing the amount of current to the particular cell stack, while maintaining the amount of current to the other cell stack includes providing charging current to the particular cell stack and the other cell stack for a substantially equal period of time. In another embodiment, the step of altering a charging condition in response to detection of the fault condition includes substantially depleting the particular cell stack of stored energy and subsequently creating a short circuit across the particular cell stack to maintain it in an uncharged state.

Other aspects, embodiments, features and elements of the invention will be discussed in detail below with regard to the illustrative embodiments.

BRIEF DESCRIPTION OF THE DRAWINGS

The invention will now be described with regard to the following illustrative drawings in which like referenced designations refer to like elements, but in which the elements may not be draw to scale. It should be noted that the following drawings are illustrative in nature and are not intended to limit the scope of the invention.

DESCRIPTION OF ILLUSTRATIVE EMBODIMENTS

As discussed above in summary, the invention addresses the deficiencies in the prior art by providing, in various embodiments, improved, methods, systems and features for controlling, monitoring, charging and/or discharging (collectively "controlling") flowing electrolyte batteries. According to some illustrative embodiments, the invention addresses the deficiencies in the prior art by providing methods, systems and features for controlling individual stacks of battery cells in a flowing electrolyte battery. In other illustrative embodiments, the invention provides methods, systems and features for controlling individual battery cells in a flowing electrolyte battery. In other illustrative embodiments, stack controllers and sensors interconnected with individual battery stacks and/or cells provide detection of a fault conditions, and in response to detecting such fault conditions, alter one or more charging conditions of individual battery stacks and/or cells. If necessary, alterations can be repeated and/or iterated and an operator can be alerted about the fault conditions.

It is to be understood that although the following illustrative discussion utilizes the terms "battery" and "stack," the scope of the invention is not so limited. In a broader sense, the invention enables the control of individual charge storage units in an array of interconnected charge storage units in a battery, such as a flowing electrolyte battery, regardless of the terminology used to describe the individual units or the array. For example, in one illustrative embodiment, the invention enables the control of individual cell stacks in a battery of interconnected cell stacks. It is this exemplary embodiment that is developed in the remainder of the illustrative description. However, in other illustrative embodiments, the invention can be described as enabling the control of individual cell stacks in a tower of interconnected cell stacks. In other illustrative embodiments, the invention can be described as enabling the control of individual battery cells in a stack of battery cells, and so on.

The term "battery" is to be understood to refer to an array of charge storage units, such as an array of interconnected cell stacks, while a "stack" is to be understood to refer to an individual charge storage unit, such as a stack of battery cells, for which individual control is desired.

Some of the illustrative embodiments of the invention are employ a single source of dc current for charging all of the cell stacks in the battery. These embodiments are described particularly with respect to FIGS. 1-9. However, in other illustrative embodiments, the invention is provides multiple independent dc current sources; preferably one for each cell stack. These embodiments are particularly described below with respect to FIGS. 7 and 8.

Figure 1:
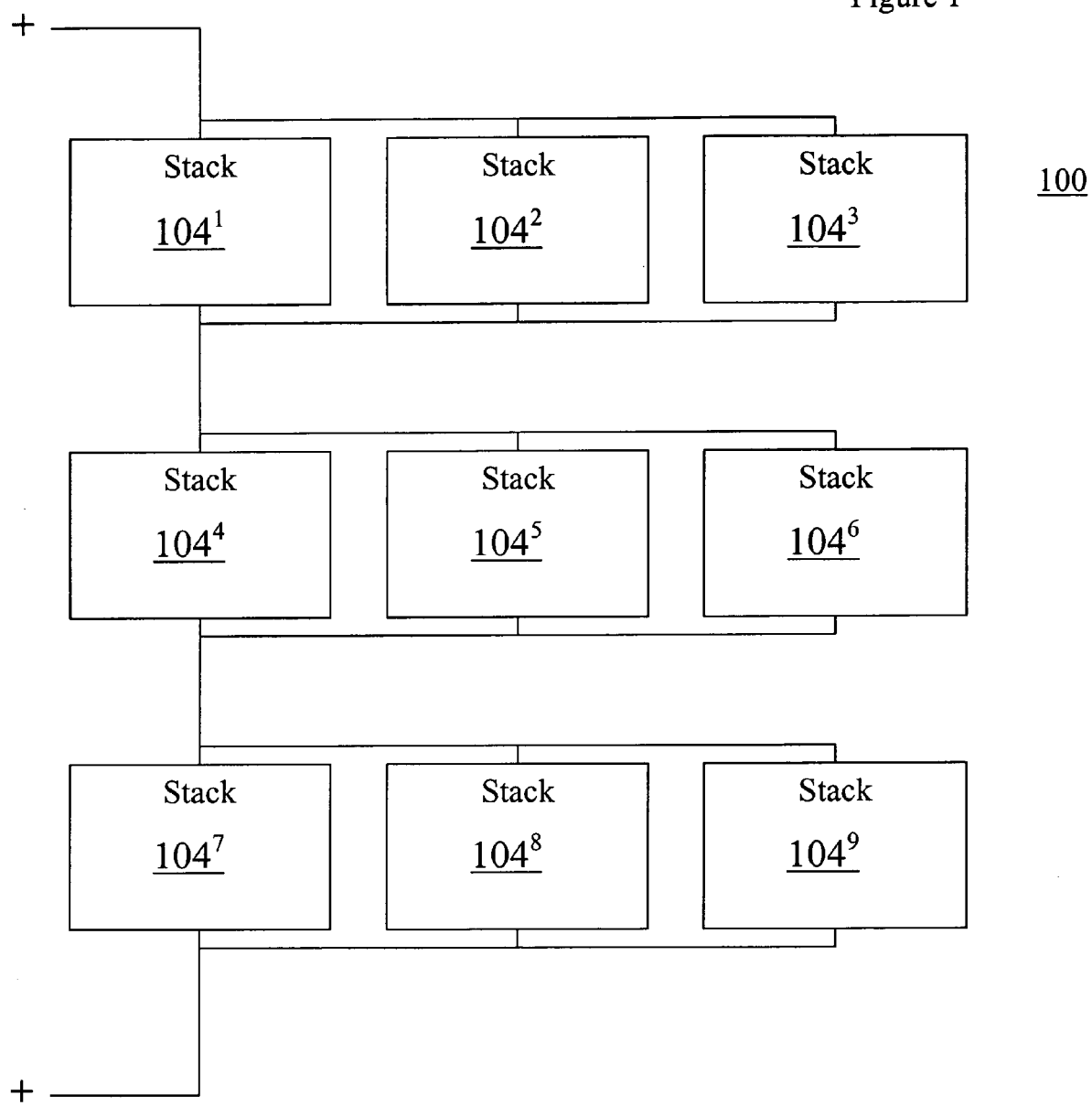
FIG. 1 schematically depicts a flowing electrolyte battery including a plurality of cell stacks of a type that may be employed with an illustrative embodiment of the invention.

FIG. 1 depicts an exemplary flowing electrolyte battery 100 constructed from nine cell stacks $104^1 \ldots 104^9$ (generally "cell stacks 104") of the type that may be employed with illustrative embodiments of the invention. The exemplary battery 100 includes three groups of three stacks 104 electrically connected in parallel—e.g., the stacks $104^1$, $104^2$, and $104^3$ form one group of stacks 104 electrically connected in parallel. Together, the three groups of stacks are electrically connected in series to form the battery 100. The stack topology illustrated in FIG. 1 is purely illustrative and selected to facilitate discussion, since illustrative embodiments of the invention interoperate with batteries possessing arbitrary internal topologies, stack and cell configurations.

In this example, the stacks 104 are hydraulically interconnected (not shown) to permit the sharing of a common, flowing electrolyte. This enables the battery 100 to achieve a higher energy density relative to a battery with electrically interconnected stacks that are not hydraulically interconnected, and therefore, have separate, non-flowing electrolytes. In this example, the battery 100 is a zinc-bromide battery and the flowing electrolyte is an aqueous zinc bromide solution.

Figure 2:
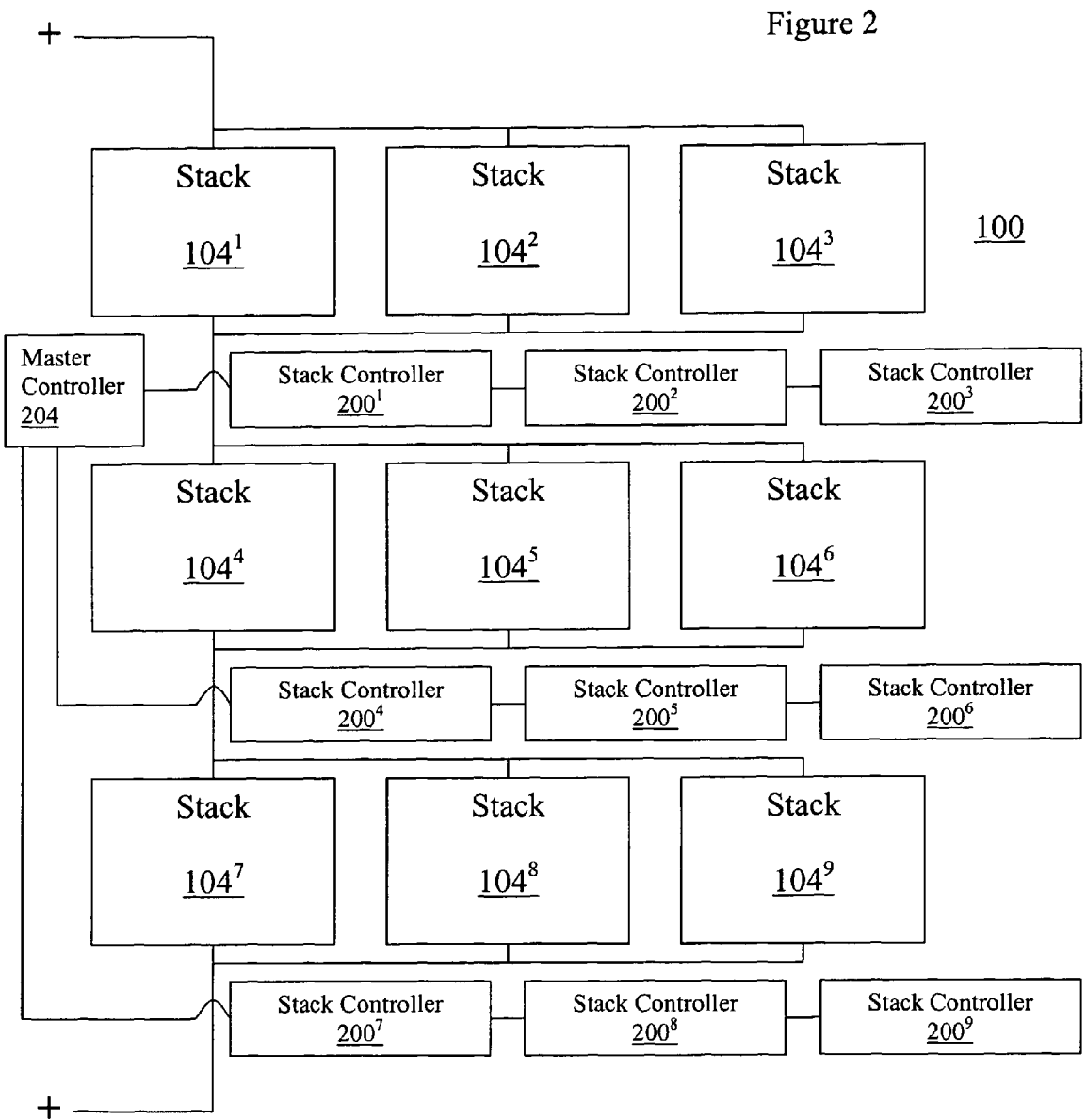
FIG. 2 is a schematic block diagram showing an exemplary implementation of a cell stack controller interconnected to a battery of the type depicted in FIG. 1 according to an illustrative embodiment of the invention.

Illustrative embodiments of the invention can be sold separately for integration with a flowing electrolyte battery, such as the battery 100 of FIG. 1. Alternatively, as illustrated in FIG. 2, the invention may be configured to be integrated with the flowing electrolyte battery 100 and sold as a single unit. In this illustrative embodiment, each stack 104 is electrically connected to a stack controller $200^1 \ldots 200^9$ (generally 200). The stack controllers 200 are, in turn, electrically connected to a master controller 204.

In the illustrative embodiment of FIG. 2, the interconnections permit powering of individual stack controllers 200 and the master controller 204, as well as exchange of data and/or commands among the individual stack controllers 200, the master controller 204, or both. For example, a regulated dc power supply can utilize the electrical interconnections to provide power to the stack controllers 200 and the master controller 204, or the master controller 204, itself, can include the functionality of the power supply and selectively supply power to each individual stack controller 200. The interconnections can include dedicated lines for exchanging data and/or commands between the various controllers. Additionally, data and power may be provided over the same line. The exchange of data between controllers can be accomplished using protocols known to the art, such as RS-232, $I^2C$ or CAN Bus. It is also possible to exchange data and/or commands between controllers using known wireless protocols, such as Bluetooth or IEEE 802.11(b). Additionally, as mentioned above, interconnections may be optically isolated, using for example, fiber optic interconnections.

In the illustrative embodiment of FIG. 2, the master controller 204 controls the interface between the battery 100 and an external application that the battery 100 powers—for example, an inverter feeding a shaped 480 VAC, three phase waveform to semiconductor processing equipment. The master controller 204 monitors the power available to the battery 100. When surplus power is available, the master controller 204 charges the battery 100 by providing a charging current to the stacks 104. When the power supplied to the battery 100 is insufficient to meet the requirements of the load, the master controller 204 draws power from the stacks 104 and provides it to the load. In one embodiment, the master controller 204 also detects a sudden demand for power that exceeds the load's average demand by a predetermined amount and supplies the difference instantaneously or nearly instantaneously from the battery 100. Preferably, the master controller 204 also controls operation of electrolyte pumps and numerous other support systems in the battery, e.g., cooling systems, user interfaces, system telemetry, and the like.

Internal defects in a cell stack 104 typically result in a lowered internal resistance in that stack 104; in some configurations drawing charge current away from its nearest neighbor stacks 104. Therefore, in the illustrative embodiment of FIG. 2, one function of the stack controller 204 is to reduce the magnitude of the current entering a faulty stack 104. Assuming a single dc current source supplies all of the cell stacks 104, stripping one stack by reducing the charging current at the current source entails stripping the entire battery, which requires significant down time, effectively removing the battery from operation as discussed above. By reducing the charge current to a faulty stack 104, while the other stacks 104 continue to charge, the invention causes the flowing electrolyte to become increasingly reactive and removes deposited zinc from the faulty stack 104, eliminating dendrites and other plating defects that can cause a drop in internal resistance and, in turn, open-circuit voltage. This approach effectively enables a single stack to be sufficiently stripped to cure a fault, without necessitating taking the battery offline or stripping the remaining cell stacks.

The controllers 200 and 204 may be implemented in any suitable manner. By way of example, in some illustrative embodiments, one or more of the controllers 200 and 204 may be a programmed-logic device (PLD), a programmable-logic array (PLA), a field-programmable gate array (FPGA), or other specialized hardware device. In other illustrative embodiments, one or more of the controllers 200 and 204 may be a software process executing on a single processor, a multiprocessor computer, or a distributed processing array executing an operating system.

Figure 3:
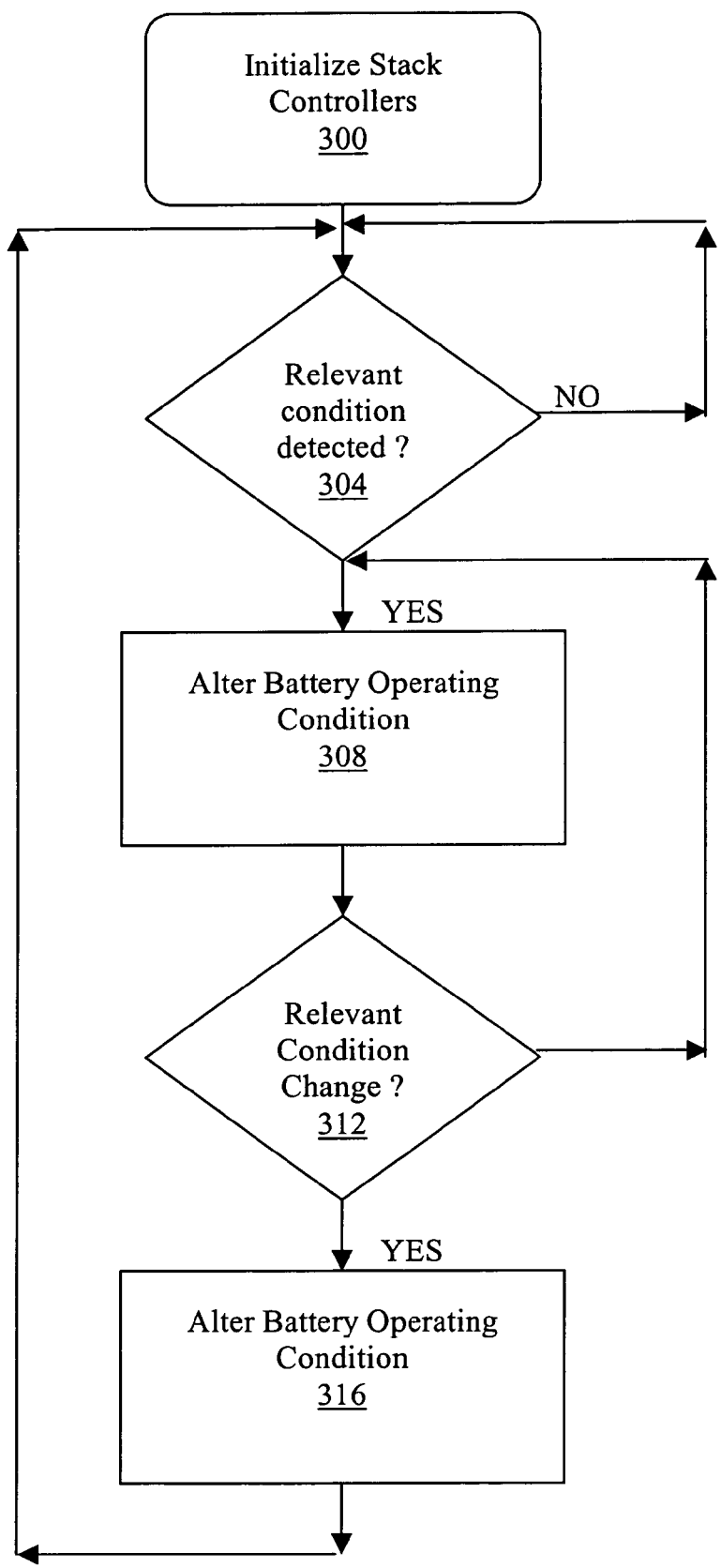
FIG. 3 is a flowchart depicting a process for individual stack control in a flowing electrolyte battery according to an illustrative embodiment of the invention.

FIG. 3 is a simplified flowchart summarizing a process for individually controlling a cell stack in a flowing electrolyte battery according to an illustrative embodiment of the invention. Using this process or a similar process, stack controllers, such as the stack controllers 200 control associated cell stacks, such as the cell stacks 104. Preferably, control includes monitoring the associated cell stacks for conditions relevant to stack operation. Such monitoring can include monitoring for fault conditions. However, a plurality of relevant battery operating conditions, including, without limitation: cell, stack, and/or battery open circuit voltage, current in and out, charge capacity, temperature, and/or resistance; under and/or uneven electrode plating; load demand; power grid voltage/status; electrolyte flow status, rate, volume and/or obstructions; electrolyte chemical composition; electrolyte stack leaks from a leak sensor; stack weight from, for example, a strain gauge; the state of one or more pumps circulating the flowing electrolyte in the battery from, fore example, a pump sensor; and the like. As shown at 300, when the system is first activated, the stack controllers are initialized. After successful initialization, the stack controllers monitor (step 30 4) operably connected cell stacks, such as a cell stack 104.

In response to a relevant condition being detected at step 304, the stack controller alters an operating condition (e.g., a charging condition) of the battery 100 at step 308. For example, in response to detecting an unacceptable deviation in a cell and/or stack voltage and/or current, the stack controller 200 may alter one or more charging conditions associated with the stack 104. This may include increasing or decreasing the charging current to a particular cell stack. Additionally, in response to, for example, detecting an unacceptably high temperature or low internal stack resistance, the stack controller 200 may take a particular stack offline to avoid thermal run away. The stack controller may also initiate partial online stripping of a particular stack. Also, in response to, for example, a decrease in line voltage, a change in load, or a power grid failure, the stack controller 200 may take steps to switch the battery from drawing current for charging to providing uninterrupted power to the line. In step 312, the stack controller 200 detects a correction or change in the initially detected condition in the stack. If the condition persists or is not corrected, the stack controller 200 may continue to provide the remedial action of step 308 until the condition changes, or until a predetermined failure condition (e.g., a time out) is satisfied. In response to detecting a change in the relevant condition, in step 216, the stack controller 200 can again alter one or more battery operating conditions. For example, the stack controller 200 may restore the original charge condition that existed before detection of the relevant condition at step 304. Alternatively, the stack controller may bring a stack back online, or for example, in response to detecting that the power grid is back online, initiate a process to halt the battery from supporting the line and return it to a charging or other quiescent mode.

With particular reference to a zinc-bromide battery 100, a fault condition can manifest itself as a drop in the open-circuit voltage across or the charge current through a stack, such as a stack 104. As discussed in greater detail below, according to the illustrative embodiment, the stack controller remedies the fault by reducing the amount of charge current entering the stack 104. Reducing the charging current enables the corrosive electrolyte to remove zinc from the electrodes of the cells included in the stack 104. When enough zinc is removed to essentially correct the fault condition (e.g., remove a dendrite, nucleation feature, over plating or some other electrode plating anomaly), the correction is detected by an increase in the open-circuit voltage or a decrease in the charge current entering the stack. In response, the stack controller 204 restores the charge current to its original value. If the fault is not corrected, the stack controller 204 can maintain the reduced charge current relative to the other stacks 104 in an attempt to further deplete the stack 104 of elemental zinc. In one illustrative embodiment, if repeated remedial measures (e.g., multiple cycles of depletion) fail to correct the defect, the stack controller 200 may alert an on-site or off-site operator, either directly or indirectly using, for example, the master controller 204.

Figure 4:
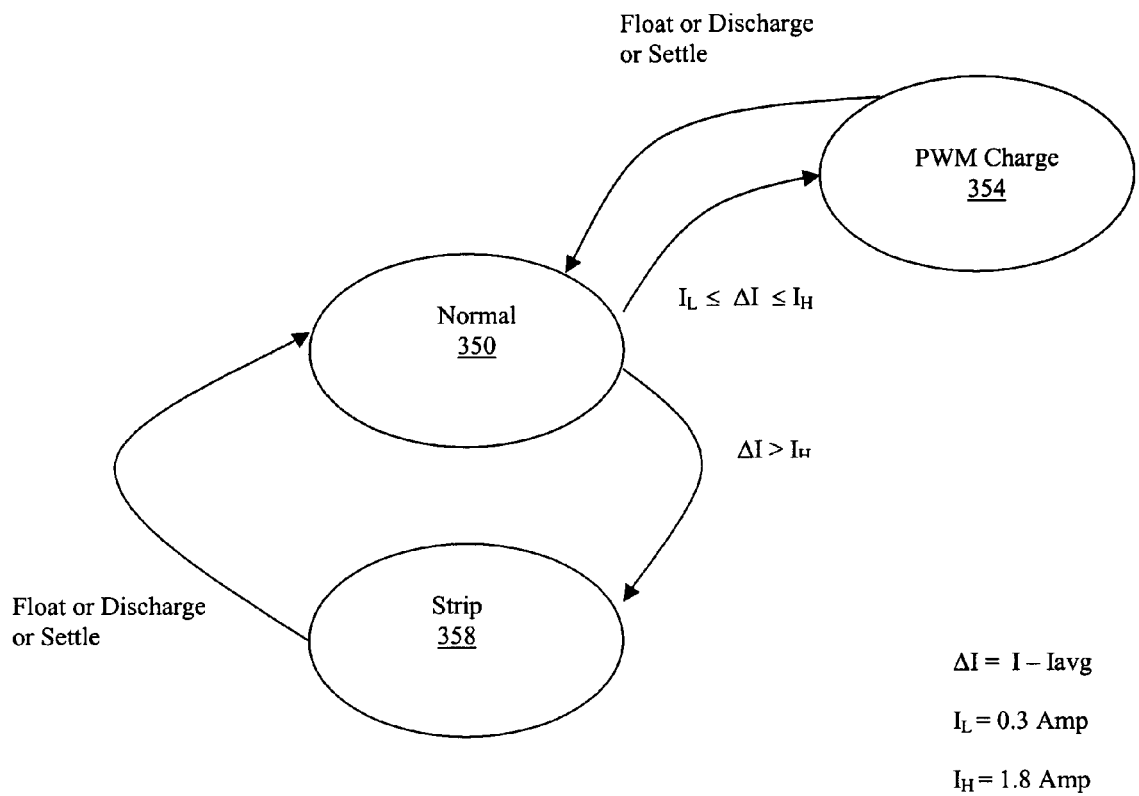
FIG. 4 is a state diagram depicting an illustrative state machine implementation of a process of the type depicted in FIG. 3.

FIG. 4 depicts a simplified state diagram depicting a current control process in accord with the illustrative embodiment of FIG. 3. The state diagram may be implemented in the stack controller 200, for example, as a programmed logic device (PLD) or as a general purpose or dedicated processor executing the appropriate instructions. After initialization, the stack controller 200 enters a NORMAL state 350. The stack controller receives an input, $\Delta I$, reflecting a difference between the charging current entering the associated stack 104 and a current threshold value.

In one illustrative implementation, the threshold current value is a function of the average current that has entered the particular stack 104 over a previous period of time. In another illustrative implementation, the threshold value is chosen as an ideal charging current to be provided to the stack. For example, if the array of stacks was composed of 3 parallel-connected groups of 2 series-connected stacks 104 and the charging current provided by the master controller was 100 A, the predetermined current value per stack 104 would be about 16 A. According to another illustrative embodiment, $\Delta I$ is calculated as a deviation from an actual measured average of the charging current provided to all of the cell stacks 104.

According to the illustrative embodiment, if $\Delta I$ remains below a selected first value, e.g., less than plus or minus about 0.1 A, 0.25 A, 0.5 A, 0.75 A, 1 A, 1.5 A, 2 A, 2.5 A or 3. A, the stack controller 200 remains in the NORMAL state 350 and does not take action to alter the charging conditions associated with the stack. If ΔI exceeds the first value but does not exceed a second value (e.g., 0.25 A, 0.5 A, 0.75 A, 1 A, 1.5 A, 2 A, 2.5 A or 3 A), the controller 200 progresses to the PWM_CHARGE state 354 under the assumption that there is an incipient problem in the stack 104 that can be corrected by reducing the charging current into the stack 104. Under this condition, the stack controller 200 may employ a variety of techniques to adjust the charging current. In one configuration, the stack controller 200 applies pulse-width modulation with a duty cycle of less than 100% to the charging current to reduce the overall amount of charge current entering the stack 104. In one implementation, the period for the pulse-width modulation is on the order of about 100 seconds, so as to allow sufficient time for ion diffusion through the flowing electrolyte.

In an alternative implementation, and as discussed below with respect to FIGS. 7 and 8, in state 354, the stack controller may include a dc/dc controller/converter dedicated to the particular stack to be adjusted. In this implementation, the dc/dc controller/converter adjusts the current being provided to or taken away from the stack 104, independent from and without any effect on the remaining stacks. The current to a stack with a lowered internal resistance can also be limited by providing the stack with current for only a particular time period, less than the time period for which current is normally provided.

As a result of reducing current to or removing current from the stack 104, the stack 104 loses elemental zinc and thus, stored energy from its electrodes. This eliminates, for example, the dendrite, nucleation, or other uneven plating feature causing a reduction in the internal resistance of the stack. This process is colloquially referred to as "open stripping." If open stripping successfully completes and the battery 100 enters either a discharge mode (where it powers the load), a float mode (where the battery 100 is fully charged and awaits utilization), or a settle mode (where the controller 200 samples at periodic intervals the charge current into the battery as it charges), then the controller 200 returns to the NORMAL state 350.

If ΔI exceeds the second value, then the stack controller 200 progresses to the STRIP state 358, concluding that the associated stack 104 is experiencing a significant problem, such as internal shorting, that cannot be corrected merely by reducing the charging current entering the stack 104. The controller 200 initiates procedures to shallow or deep strip the stack 104, which may or may not require taking the battery off line, as discussed in greater detail below. If the stripping process successfully completes and the battery 100 enters either a discharge mode (where it powers a load), a float mode (where the battery 100 is fully charged and awaits utilization), or a settle mode (where the battery samples at periodic intervals the charge current into the battery as it charges), then the controller 200 returns to the NORMAL state 350 and returns to monitoring for a change in a relevant battery operating condition in step 304.

The state diagram of FIG. 4 reflects the independent operation of the stack controllers 200, each associated with a particular stack 104. According to a feature of the illustrative embodiment, if only one particular stack 104 or a minority of stacks 104 in the battery 100 is experiencing an operational fault, the remaining stack controllers 200 continue to command their associated stacks to receive the normal charge current as if there was no problem with the faulty stack 104. In this way, the illustrative embodiment keeps the battery online and available to provided backup power if called upon to do so.

Figure 5:
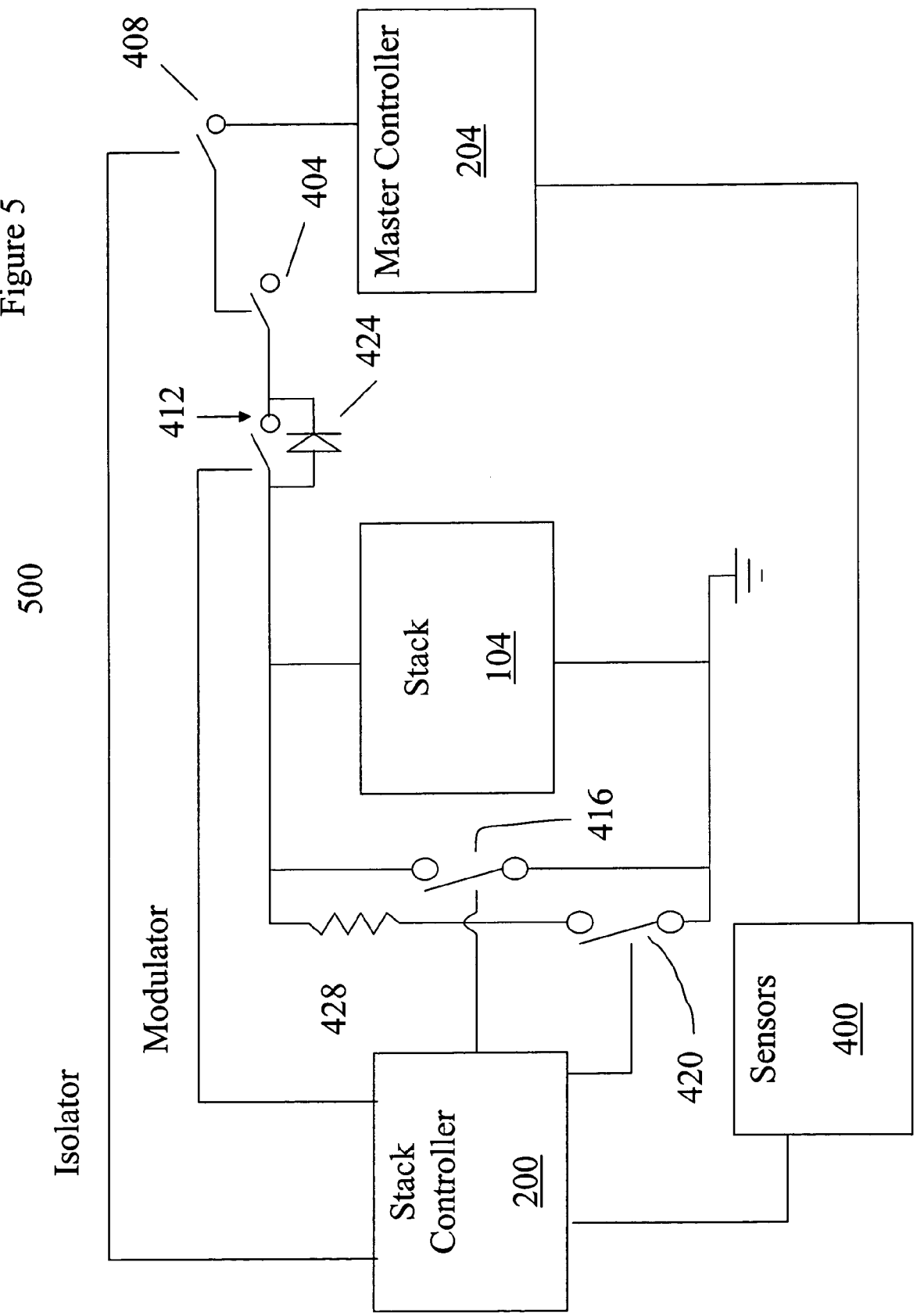
FIG. 5 is a schematic diagram depicting an interconnection between one cell stack and a stack controller according to an illustrative embodiment of the invention.

FIG. 5 is a schematic block diagram 500 of an exemplary interconnection between a stack controller 200, its associated stack 104 and master controller 204 according to one illustrative embodiment of the invention. The stack controller 200 operably communicates with the sensors 400, from which it receives one or more sensor measurements as an input. As discussed above, sensor inputs may include, for example, cell, stack, and/or battery open circuit voltage, current in and out, charge capacity, temperature, and/or resistance; under and/or uneven electrode plating; load demand; power grid voltage/status; electrolyte flow status, rate, volume and/or obstructions; electrolyte chemical composition; ph of electrolyte, electrolyte stack leaks from a leak sensor; stack weight from, for example, a strain gauge; the state of one or more pumps circulating the flowing electrolyte in the battery from, fore example, a pump sensor; and the like. The stack controller 200 also communicates with the control inputs of the switches 404, 408, 412, 416 and 420, through which it can selectively open and close the appropriate switch and control the charge and discharge of the stack 104. In another embodiment, the stack controller 200 can also control the charge and discharge of the stack 104 by mechanically throttling the flow of electrolyte to the stack 104. The master controller 204 also communicates with the switches 404 and 408 and the control terminal of the switch 404. The switches of FIG. 5 can take the form of a collection of discrete components (e.g., relays and/or IGBTs) interconnected on a circuit board, or a collection of power transistors, (e.g., power MOSFETs, on a single silicon die).

According to one feature, the stack controller 200 either includes or is in communication with a condition history logger, which records the data from the sensors over time. According to another feature, the stack controller 200 includes or is in communication with a timer that can provide a system time or a signal indicating the passage of a period of time.

In response to the stack controller 200 closing the isolator switch 408, the master controller 204 takes control of the assertion of the contactor switch 404. The contactor switch 404 is normally in a contact-open position, inhibiting the flow of charge current between the master controller 204 and the stack 104. By asserting the contactor switch 404, which is typically incidental to charging the stacks 104 in the battery 100, the master controller 204 provides a necessary, but insufficient path, to initiate charging the stack 104.

The stack controller 200 controls the assertion of the isolator switch 408, the modulator switch 412, the short switch 416, and the discharge switch 420. The isolator switch 408 permits stack controller 200 to control whether the master controller 204 can assert the contactor switch 404. If a fault or other relevant operating condition is detected in the stack 104 that requires the electrical isolation of the stack 104, the stack controller 200 opens the isolator switch 408, preventing the master controller 204 from creating a path for a charge current to the faulty stack 104.

The modulator switch 412 is enables the stack controller 200 to regulate the charging current to the stack 104 through pulse-width modulation, as discussed above. By generating a series of rectangular pulses, with the appropriate duty cycle, and applying them to the control terminal of modulator switch 412, the charge current provided to the stack 104 is pulse-width modulated, without substantially affecting, or only affecting in a predictable manner, the charge current provided to any other stack 104. The diode 424 enables the stack 104 to provide power to a load on the battery 100 when the switch 412 is open. More particularly, the modulator switch 412 requires a finite amount of time to change state, which can cause a delay in supplying power from the stack 104 to a load. The diode 424 is reverse-biased in normal operation—i.e., during charging of the stack 104—but becomes forward biased in the event that the master controller 204 attempts to draw power from the stack 104, permitting the circumvention of an open modulator switch 412 until the modulator switch 412 has had sufficient time to close and establish a path for the outflow of current from stack 104 to the load.

The short switch 416 enables deep discharge of stack 104. In the event that a full strip of the entire battery 100 has been ordered, the stack controller 204 first either opens or operates at a low duty cycle the modulator switch 412 to enable the corrosive electrolyte to strip the stack 104, or shallow strips the stack by engaging the discharge switch 420, as discussed below. When the amount of stored energy remaining in the stack 104 is sufficiently small that shallow or open stripping requires a significant amount of time, closing the short switch 416 causes a short circuit across the terminals of the stack 104, facilitating the removal of the remaining stored energy.

The discharge switch 420 permits the stack controller to slowly strip the stack. Closing the discharge switch 420 places a power resistor 428 in parallel with the stack 104, significantly reducing the amount of current received by the stack 104 relative to the reduction of current available through operation of the modulator switch 412.

In considering the above described illustrative embodiment, it should be noted that the functionality of the invention can be differentially allocated between the stack controllers 200 and the master controller 204 in various embodiments. For example, in the illustrative embodiment, the stack controllers 200 individually implement the fault detection and charging functionality associated with each individual stack 104, while the master controller 204 controls the charging of the stacks 104 in the battery 100 as a whole. Such an embodiment is useful for applications that value distributed control and increased fault tolerance.

In another illustrative embodiment, the stack controllers 200 are essentially conduits for sensor measurements from the stack 104 to the master controller 204. In turn, the master controller 204 makes operational decisions concerning the charging and discharging of individual stacks 104 based on the provided data. Such an embodiment may be preferred, for example, when it is possible to integrate the functionality of stack controllers 200 and master controller 204 on a single integrated circuit, which can result in significant cost savings.

In a further illustrative embodiment, the master controller 204 merely reports commands received from an outside operator using a user interface, such as a control panel, or a network link, or other telecommunications connection. In this embodiment, in addition to the functionality described above, the stack controllers 200 are also dc/dc converters. In contrast to the previously discussed system, which had only one dc current source for charging all the stacks 104 and relied on throttling the dc current at the individual stacks 104 to effectuate stripping, this embodiment features one dc current source per stack 104. This enables the selective charging and discharging of any individual stack 104 in the battery, regardless of the charge or discharge state of the other stacks 104. In one version of this embodiment, stack controllers 200 maintain historical sums of the currents entering and leaving their associated stacks 104 as indicated by associated charge sensors 400. If any of these historical sums are negative, the appropriate stack controller 204 will charge the appropriate associated stack 104. This illustrative embodiment is discussed in further detail with respect to FIGS. 7 and 8.

Figure 6:
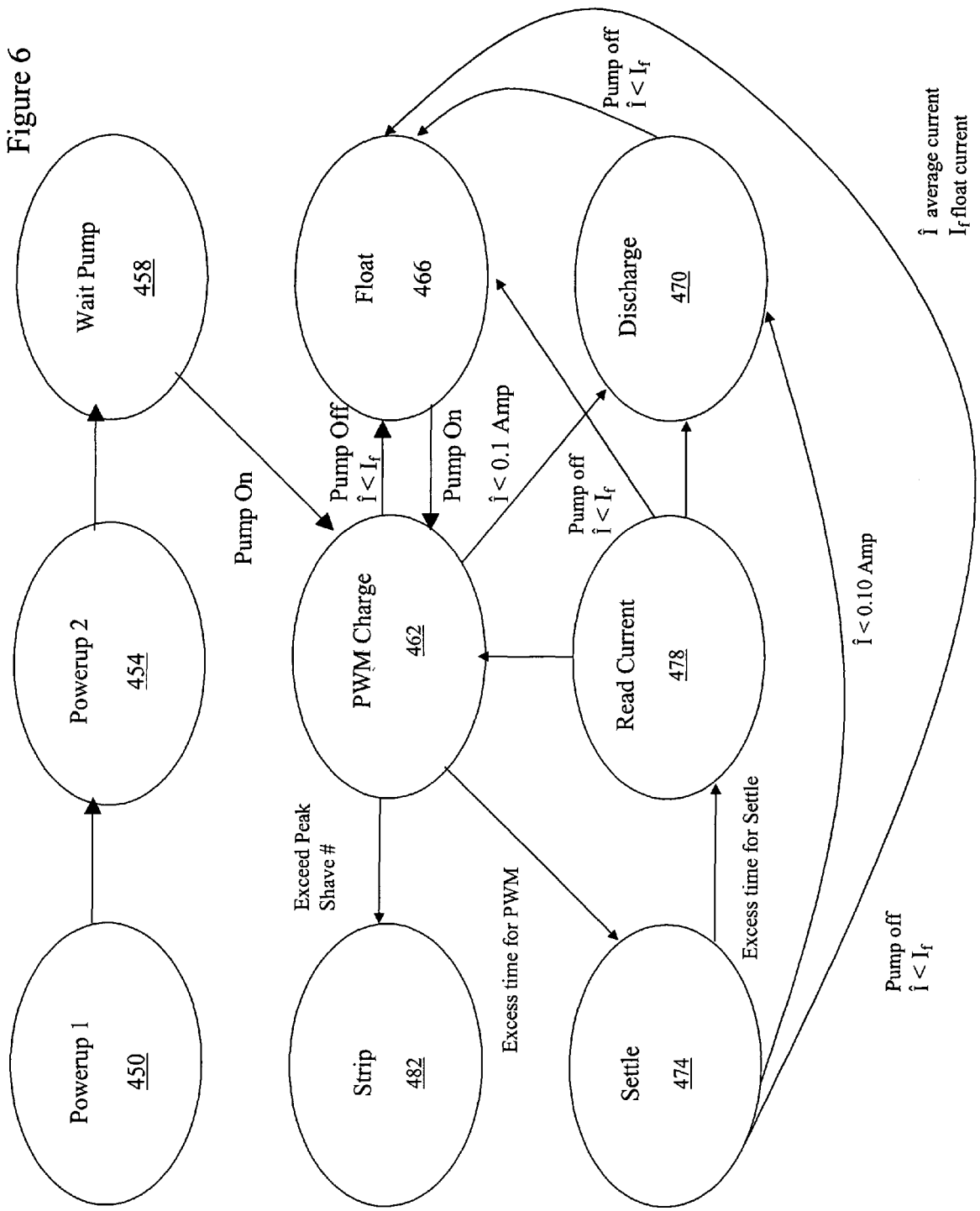
FIG. 6 is a state diagram illustrating the operation of the stack controller of the type depicted in FIG. 5.

FIG. 6 is a state diagram depicting an exemplary operation of the stack controller 200 as interconnected in the illustrative embodiment of FIG. 5 in response to various operating conditions detected in the stack 104 and the battery 100 by the sensors 400. The logic implementing this state diagram may be programmed in the stack controller 200. In this embodiment, there is no sensor that directly provides the state of the contactor switch 404 or the master controller 204 to the stack controller 200. However, the stack controller 200 can indirectly detect the mode of operation of the master controller 204 by monitoring the state of an electrolyte pump subsystem (not shown). Before the master controller 204 charges or depletes the stacks 104 in the battery 100, it activates the pump subsystem to circulate the flowing electrolyte between stacks 104. If the stack controller 200 detects activity in the pump subsystem, it knows that the master controller 204 is preparing to source or sink current from the battery 100. Otherwise, it knows that the battery is either charging or "floating," i.e., standby in a fully charged state.

At initialization, the stack controller 200 enters the POWERUP1 state 450. The modulator switch 412, isolator switch 408 discharge switch 420 and short switch 416 are all open. After the passage of about 100 milliseconds, the stack controller 200 enters the POWERUP2 state 454. The modulator switch 412 is closed to provide a necessary connection to charge the stack 104, which itself is insufficient until the isolator switch 408 is also closed.

After about another 100 milliseconds, the stack controller 204 enters the WAIT_PUMP state 458. The modulator switch 412 and isolator switch 408 are closed, permitting the master controller 204 to direct charging current to the stack 104 upon the closing of the contactor switch 404. The stack controller remains in the WAIT_PUMP state 458 until a pump sensor 400 indicates that the pumps circulating the electrolyte are active, at which time the stack controller enters the PWM_CHARGE state 462. In the PWM_CHARGE state 462, the isolator switch 408 is closed and the modulator switch 412 can be either open or closed, as the stack controller 204 applies pulse-width modulation to the charging current, as discussed above.

If the pump subsystem is disabled and the average stack current into the stack 104 is below a first threshold value (as discussed above with respect to FIG. 4), then the stack controller transitions from the PWM_CHARGE state 462 to the FLOAT state 466. In the FLOAT state 466, the stack 104 is substantially fully charged and idles until current is required from it. In the FLOAT state 466, the modulator switch 412 is open, while the isolator switch 408 remains closed. If the modulator switch 412 is closed and the pump subsystem is activated, after about 100 milliseconds, the stack controller 200 returns to the PWM_CHARGE state 462.

If, while in the PWM_CHARGE state 462, the average current into the stack drops below a second threshold value less than the first threshold value discussed above—e.g., about 0.1 A in one implementation, then the stack controller 200 transitions to the DISCHARGE state 470. In the DISCHARGE state 470, the modulator switch 412 and the isolator switch 408 are both closed. If the pump subsystem is idle and the average current into the stack 200 remains below the first threshold value, then the stack controller 204 enters the FLOAT state 466. If the stack 104 begins to source current in excess of a third value (e.g., greater than about 1 A, 1.25 A, 1.5 A, 1.75 A, 2 A, 2.5 A, 3 A, or 3.5 A) then the stack controller 200 reenters the PWM_CHARGE state 462.

If, while in the PWM_CHARGE state 462, an amount of time passes in excess of the period for the pulse-width modulation discussed above (in one embodiment about 60 seconds), then the stack controller 200 transitions to the SETTLE state 474. The modulator switch 412 and the isolator switch 408 remain closed. If the pump subsystem is inactive and the average current into the stack 200 is less than the first threshold value, then the stack controller 200 enters the FLOAT state 466, as discussed above. If the average current into the stack 200 is less than the second threshold value, then the stack controller enters the DISCHARGE state 470. If a predetermined period of time passes (in one embodiment about 55 seconds) without either of these transitions occurring, then the stack controller transitions to the READ_CURRENT state 478, before transitioning back to the PWM_CHARGE state 462. If the stack 104 is brought online to supply power to a load (i.e., peak sharing mode) more than ten times while the stack controller is in PWM_CHARGE state 462, then the stack controller 200 enters the STRIP state 482, and forces the master controller 204 to initiate a strip of the entire battery 100, alerting an operator to a fault condition.

Figure 7:
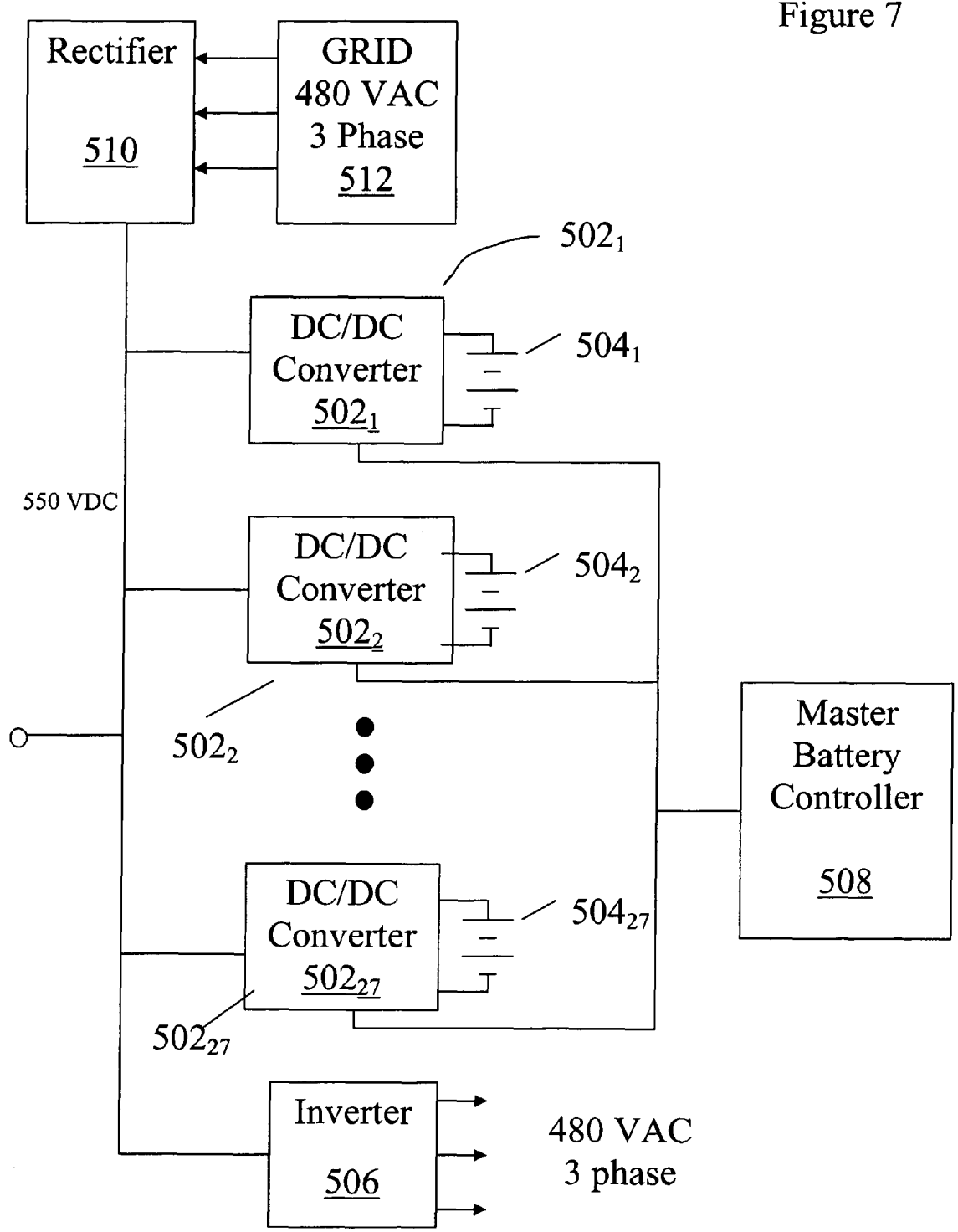
FIG. 7 is a block diagram of a stack controller approach according to an alternative illustrative embodiment of the invention.

FIG. 7 is a schematic diagram of an individual stack control system 500 employing a dedicated dc/dc converter/controller 502₁ through 502₂₇ (collectively 502) to control each of 27 battery stacks 504₁ through 504₂₇ (collectively 504). Each of the battery stacks 504 are connected with each other in parallel and include 54 cells. The output voltage from the dc/dc converter/controllers 502 is nominally about 550 Vdc and is provided to an inverter 506 to supply the load with 580 VAC three phase. A rectifier 510 rectifies the 480 Vac three phase voltage from the power grid 512 and provides it to the dc/dc converter/controllers 504 for charging the battery stacks 508. A master battery controller 508 communicates with each of the dc/dc converter/controllers 502, for example, over a CAN bus, to exchange information and to provide control commands and sensor information to the dc/dc converter/controllers 502. The dc/dc converter controllers 502 can perform all of the functionality of the various illustrative stack controllers described above. Also, like the previously described illustrative embodiments, functionality may be divided between the dc/dc converter/controllers 502 and the master battery controller 508 in any suitable way.

As described below in more detail with respect to FIG. 8, the dc/dc controller/converters 502 are bidirectional and include both a buck converter section and a boost converter section. The buck converter section provides charging current to an associated battery stack 504, while the boost converter section provides power to the load during discharge. As also described in more detail with respect to FIG. 8, and as in the case of the previously described embodiments, one feature of the system 500 is that the master controller 508 tracks the state of all of the battery stacks 504 with respect to their availability to provide backup power to the load. More particularly, the master controller 508 tracks, for example, the state of charge of each of the stacks 504, which ones are offline for servicing, and which ones are available but not at full capacity. The master controller also tracks substantially in real time the load requirements (e.g., current being drawn by the load) and the state of the grid (e.g., the voltage level of the grid). Based on this information, the master controller regulates when and to what degree the battery capacity is switched to support the load. An advantage of this feature enables the battery controller of the invention to match the support provided by the battery to the support actually required by the load during an uninterruptible power supply (UPS) event.

An advantage of the configuration of FIG. 7 is that each of the dc/dc controller/converters 502 control an associated individual battery stack 504, independently from any of the other dc/dc converter/controllers 502 controlling their associated battery stack 504. More particularly, this enables each of the dc/dc converter/controllers 502 to charge, discharge, take on- and offline, and partially or fully strip an associated battery stack 504, with negligible effect on any of the remaining battery stacks 504. Additionally, the preferred 27 stack battery configuration provides enough stacks and enough capacity that one or more stacks 504 may be taken offline, for example, for deep stripping or other service, without affecting the availability of the battery to provide backup power. The variously above described threshold voltages may also be employed with the dc/dc converter controller configuration of FIG. 7.

Figure 8:
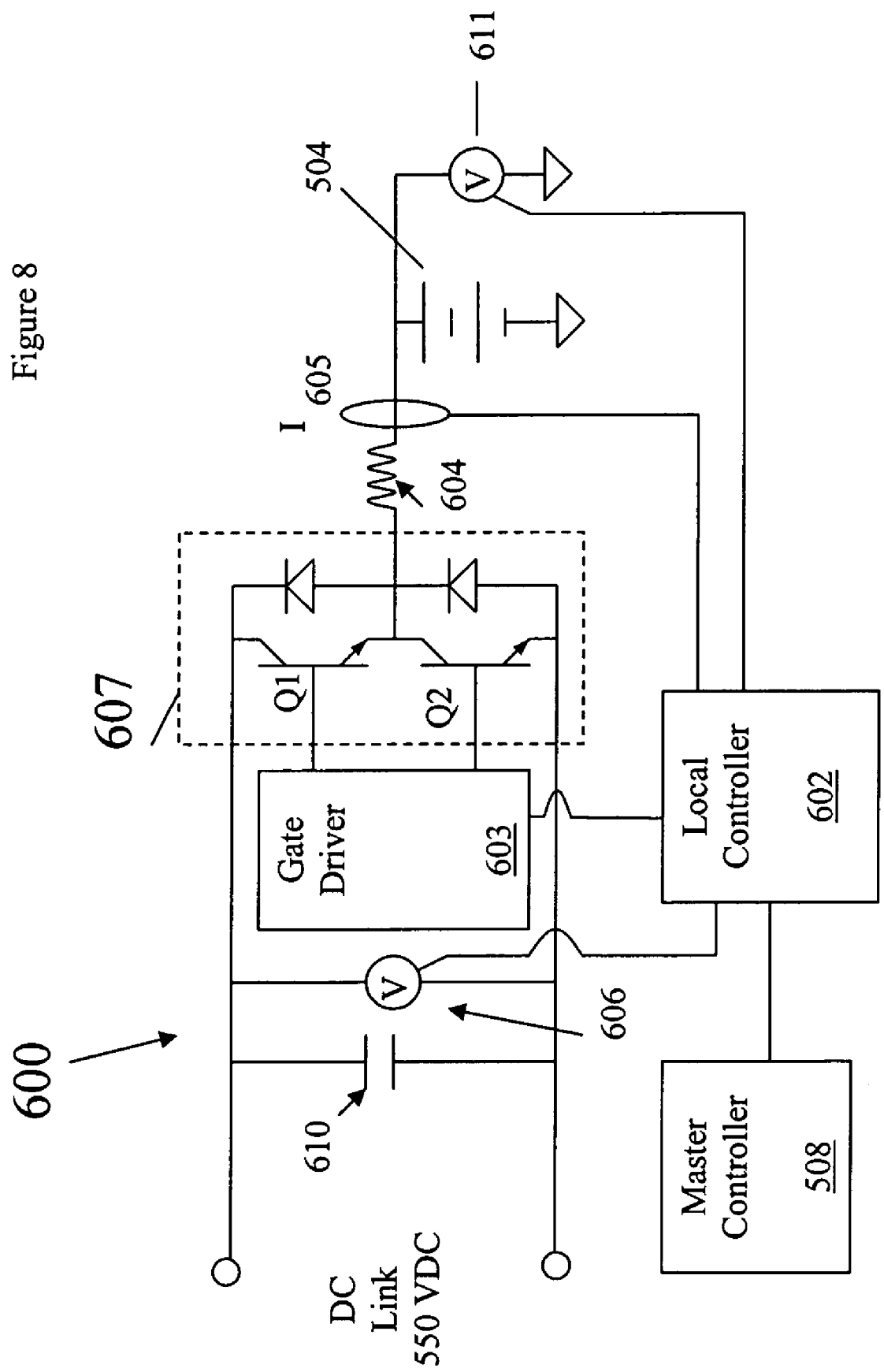
FIG. 8 is a more detailed schematic diagram of a dc/dc converter/controller of the type employed in the illustrative embodiment of FIG. 7.

FIG. 8 provides a more detailed schematic diagram of an exemplary dc/dc converter/controller 502 of the type depicted in FIG. 7. More particularly, as shown in FIG. 8, the dc/dc converter/controllers 502 include a bi-directional dc/dc converter 600 for dedicated association with a battery stack 504. The bidirectional dc/dc converter 600 converts a dc link voltage (shown as 550 Vdc in FIG. 7) from, for example, the rectifier 510 of FIG. 7, to a current that charges the stack 504. It can also discharge the stack 504 by taking power from the stack 504 and converting it to a current that feeds the dc link voltage, for example, to an inverter, such as the inverter 506 of FIG. 7. In each case, it translates from one voltage to another. A local controller 602 controls the dc/dc converter/controller operation. The local controller 602 accepts commands from and exchanges information with a master battery controller, such as the controller 508 of FIG. 7. These commands include, for example, commands to charge and discharge the stack 504, and the magnitudes of such charging and discharging. The master controller 508 can also provide preload information to the local controller 602 regarding how much current will be required by the load in the event of a UPS event. A UPS event is detected by the loss of the grid. When the grid collapses, the dc link voltage drops. The greater the load being supplied the faster the dc link voltage drops. The amount of current required from each dc/dc converter/controller 502 and associated battery stack 504 is dependent on the total load and the number of battery stacks 504 that are online and available to deliver power. There may be a time when an individual stack is being stripped or faulty and not available to deliver power. Thus, the master controller 508 knowing the total load requirements and the number of stacks 504 that are available, can preset the current required from each stack 504 if in the next instant a UPS event occurs. This enables each dc/dc converter/controller 502 to respond with the appropriate current command to its associated stack 504 in response to a UPS event being detected.

The local controller 602 interfaces with a power switch 607 by a gate drive interface circuit 603, which conditions the signals from a digital control level at the local controller 602 to the appropriate voltage and current levels for the upper and lower switches Q1 and Q2, respectively, of the power switch 607. The local controller 602 also provides isolation between the upper and lower switches Q1 and Q2. The power switch 6072 connects to the stack 504 through a choke (e.g., an inductor) 604. When the stack 504 is being charged, the upper switch Q1 is pulse width modulated by the local controller 607 and the gate drive 603. A current sensor 605 provides current feedback to the local controller 607. The local controller 607 varies the duty cycle of the pulse width modulated signal to the upper switch Q1 to maintain a desired current. When the stack 504 is being discharged, the lower switch Q2 is pulse width modulated by the local controller 607 and the gate drive 603, causing current to flow from the stack 504 to the dc link and thus charging the capacitor 610. According to the illustrative embodiment, a conventional boost configuration is employed to boost the voltage from the stack 504 to the dc link. As previously described, the dc link voltage is applied to an inverter, such as the inverter 506 of FIG. 7. A voltage sensor 606 and a current sensor 605 provide feedback to the local controller 602 so that it can control the current and voltage of the dc link during battery discharge.

A second voltage sensor 611 measures the voltage of the stack 504 and reports back to the local controller 602, which preferably also provides the information to the master controller 508, so that state of charge as well as any fault conditions may be determined. Each sensor has a range of appropriate values associated with each battery condition. Any value that is outside of the range may be indicative of a fault condition and appropriate corrective action is performed.

Accordingly, the invention provides in various embodiments improved methods and systems for controlling flowing electrolyte batteries, preferably as individual stacks of battery cells.

What is claimed is:

1. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition in the at least one battery cell stack based at least in part on the information regarding the operating condition,
   wherein the operating condition includes electrode plating rate in the at least one stack.

2. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition to prevent charging in the at least one battery cell stack based at least in part on the information regarding the operating condition;
   wherein the operating condition includes voltage of the at least one stack.

3. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition to prevent charging in the at least one battery cell stack based at least in part on the information regarding the operating condition;
   wherein the operating condition includes a present charged capacity of the at least one stack.

4. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition to prevent charging in the at least one battery cell stack based at least in part on the information regarding the operating condition;
   wherein the operating condition includes a temperature of at least a portion of the at least one stack.

5. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition in the at least one battery cell stack based at least in part on the information regarding the operating condition,
   wherein the operating condition includes a load demand for a load for which the system is tasked with providing power.

6. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition in the at least one battery cell stack based at least in part on the information regarding the operating condition,
   wherein the operating condition includes a state of a primary power source to a load for which the system is tasked with providing power.

7. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition in the at least one battery cell stack based at least in part on the information regarding the operating condition,
   wherein the operating condition includes stack weight for the at least one stack.

8. A system for individual stack control in a flowing electrolyte battery, the system comprising:
   a stack controller for operable interconnection with at least one of a plurality of battery cell stacks in a flowing electrolyte battery;
   a sensor input in communication with the stack controller for providing information regarding an operating condition of the at least one battery cell stack; and
   a control output in communication with the stack controller for individually controlling a charging condition to prevent charging in the at least one battery cell stack based at least in part on the information regarding the operating condition;

wherein the stack controller includes a bidirectional dc/dc converter for providing charging current to the at least one battery cell stack and for providing current from the at least one battery cell stack to a load.

9. A system for individual stack control in a flowing electrolyte battery, the system comprising:

a stack controller for operable interconnection with at least one of a plurality of battery cell stacks in a flowing electrolyte battery;

a sensor input in communication with the stack controller for providing information regarding an operating condition of the at least one battery cell stack;

a control output in communication with the stack controller for individually controlling a charging condition to prevent charging in the at least one battery cell stack based at least in part on the information regarding the operating condition; and a master controller connected to the stack controller, for controlling an interface between the flowing electrolyte battery and an external application powered by the flowing electrolyte battery.

10. A system for individual stack control in a flowing electrolyte battery, the system comprising:

a first stack controller for operable interconnection with at least one stack of a plurality of battery cell stacks in a flowing electrolyte battery;

a sensor input for providing information regarding an operating condition of the at least one stack, the operating condition selected from the group consisting of an electrolyte flow to at least one cell of the at least one stack, a chemical composition of an electrolyte available to the at least one stack, an electrode plating rate in the at least one stack, an electrolyte leak status of the at least one stack, a weight in the at least one stack, a load demand for a load for which the system is tasked with providing power, and a state of a primary power source to a load for which the system is tasked with providing power; and a control output from the first stack controller for individually controlling at least one charging condition in the at least one stack, based at least in part on the operating condition.

11. The system of claim 10, further comprising a second stack controller, and wherein the first stack controller is capable of stripping a first stack while the second stack controller is charging a second stack of the plurality of battery cell stacks.

12. The system of claim 11, wherein the first stack controller includes a plurality of local controllers, each associated with one of the plurality of battery cell stacks, for controlling the associated battery cell stack.

13. The system of claim 12, wherein controlling includes altering a charging condition of the associated battery cell stack independently from operation of others of the plurality of battery cell stacks.

14. The system of claim 11, wherein the first stack controller further comprises a bidirectional dc-dc converter.

* * * * *